(12) United States Patent
Han

(10) Patent No.: US 7,387,926 B2
(45) Date of Patent: Jun. 17, 2008

(54) METHOD FOR MANUFACTURING CMOS IMAGE SENSOR

(75) Inventor: Chang Hun Han, Icheon (KR)

(73) Assignee: Dongbu Electronics Co., Ltd., Seoul (KR)

( * ) Notice: Subject to any disclaimer, the term of this patent is extended or adjusted under 35 U.S.C. 154(b) by 371 days.

(21) Appl. No.: 11/148,212

(22) Filed: Jun. 9, 2005

(65) Prior Publication Data
US 2005/0277239 A1 Dec. 15, 2005

(30) Foreign Application Priority Data
Jun. 9, 2004 (KR) .................. 10-2004-0042207

(51) Int. Cl.
H01L 21/8238 (2006.01)
H01L 21/00 (2006.01)
H01L 21/302 (2006.01)
H01L 21/469 (2006.01)

(52) U.S. Cl. ............... 438/199; 438/21; 438/706; 257/E21.275; 257/E21.279; 257/E21.165

(58) Field of Classification Search .......... 438/199, 438/21, 706; 257/E21.251, E21.275, E21.279, 257/E21.576, E21.634, E21.636, E21.165
See application file for complete search history.

(56) References Cited

U.S. PATENT DOCUMENTS 6,025,267 A * 2/2000 Pey et al. .................. 438/656
6,551,880 B1 * 4/2003 Lai et al. .................. 438/261
6,737,291 B1 5/2004 Lim
2004/0188771 A1 * 9/2004 Yaung et al. ............... 438/300

FOREIGN PATENT DOCUMENTS

CN 1420552 A 5/2003

OTHER PUBLICATIONS

First Office Action from the State Intellectual Property Office of People's Republic of China, dated Oct. 12, 2007, in counterpart Chinese Patent Application No. 200510076946.7.

* cited by examiner

Primary Examiner—Walter L Lindsay, Jr.
(74) Attorney, Agent, or Firm—Finnegan, Henderson, Farabow, Garrett & Dunner, L.L.P.

(57) ABSTRACT

A method for manufacturing a CMOS image sensor is provided. The method includes forming a gate electrode on a semiconductor layer having defined regions of a photodiode region and a logic region, such that a gate oxide film is interposed between the semiconductor layer and the gate electrode; forming sidewall insulating films at both sides of the gate electrode, followed by forming a salicide-preventing film over an overall surface of the gate electrode and insulating films; removing the salicide-preventing film formed in the logic region; and removing a portion of the sidewall insulating films exposed by removing the salicide-preventing film, thereby exposing an upper side surface of the gate electrode.

6 Claims, 17 Drawing Sheets

METHOD FOR MANUFACTURING CMOS IMAGE SENSOR

This application claims the benefit of Korean Patent Application No. 10-2004-0042207, filed on Jun. 9, 2004, which is hereby incorporated by reference as if fully set forth herein.

BACKGROUND OF THE INVENTION

1. Field of the Invention

The present invention generally relates to an image sensor and more particularly to a method for manufacturing a complementary metal-oxide-silicon (CMOS) image sensor which can prevent generation of dark current.

2. Discussion of the Related Art

An image sensor is a semiconductor device which can transform an optical image into an electrical image and may be a CMOS image sensor or a charge-coupled device (CCD). A multitude of individual metal-oxide-silicon (MOS) capacitors, each of which can store and convey a charge carrier, are arranged in very close proximity to form a charge-coupled device. CMOS image sensors are devices which have MOS transistors respectively formed corresponding to pixels by CMOS technology, using a control circuit and a signal processing circuit as a peripheral circuit, and adopt switching technology which allows outputs to be sequentially detected through the MOS transistors.

Charge-coupled devices are known to have drawbacks, including a complicated driving manner, high electric power consumption, a complicated manufacturing process resulting from many mask processes, and a difficulty of manufacturing a single chip CCD due to the impediment of devising a signal processing circuit that can be implemented in such a chip. A continued development of CMOS image sensors by use of sub-micron CMOS technology intends to overcome these drawbacks.

There are several different types of pixel structures for CMOS image sensors. Representatively commercialized types include a pixel of a three-transistor (3-T) structure comprising three basic transistors and one photodiode and a pixel of four-transistor (4-T) structure comprising four basic transistors and one photodiode. A conventional 3-T type CMOS image sensor is shown in FIG. 1, in which the unit pixel of the 3-T type CMOS image sensor comprises three transistors and one photodiode PD.

Referring to FIG. 1, each of the three transistors comprises a reset gate Rx for resetting optical charges accumulated in the photodiode PD, a drive gate Dx serving as a source follower buffer amplifier, and a select gate Sx for addressing through switching. Here, a photodiode region A comprising the photodiode PD contains no salicide, while a logic region, i.e., the areas other than the photodiode region A, is formed with salicide. Salicide is used in the formation of the logic region so that the operating speed of the transistors Rx, Dx, and Sx can be increased, but there can be no salicide in the photodiode region A since salicide would reflect light received by the photodiode PD to reproduce an image.

Referring to FIG. 2, showing the photodiode PD and the reset gate Rx along line I-I' of FIG. 1, the 3-T type CMOS image sensor comprises a gate oxide film 2 formed on a semiconductor layer 1 having a high-concentration $p^{++}$ layer, a p-epitaxial (p-epi) layer, and a field oxide film 9 stacked therein, a reset gate 3 formed on the gate oxide film 2, and an photodiode impurity area (PDN) 4 formed in a photodiode region A at one side of the reset gate 3. An $n^+$ area 5 is formed at the other side of the reset gate 3 in the semiconductor layer 1, and spacers 6 are formed at both sides of the reset gate 3. An $n^-$ area 7 is formed under the spacer 6 near the $n^+$ area 5 in the semiconductor layer 1. As described above, a salicide film 8 cannot be formed in the photodiode region A and must be exclusively formed in the logic region. Thus, the salicide film 8 is excluded from the area of the reset gate 3 belonging to the photodiode region A and is formed only in the areas of the reset gate 3 and the $n^+$ area 5 belonging to the logic region.

A method for manufacturing a conventional CMOS image sensor will be described with reference to FIGS. 3A-3H, in which each drawing shows the photodiode region (left side, corresponding to line I-I' of FIG. 1) and the logic region (right side, corresponding to line II-II' of FIG. 1). Here, it should be noted that a typical image sensor includes a semiconductor layer having a high-concentration $p^{++}$ layer and a p-epitaxial layer in a stacked formation, which will be collectively referred to as a semiconductor layer 10.

Initially, as shown in FIG. 3A, an active area is defined by forming a local field oxide film 11 on the semiconductor layer 10 through an oxidation process, for example, a thermal oxidation process. Then, an oxide film-based gate insulating film 12 is formed to a thickness of about 50 Å on the entire surface of the active area. Next, after depositing a single or multiple conductive films of polysilicon, tungsten, or the like, gate electrodes 13 are formed by patterning through the gate conductive film in a patterning process using a mask for forming a gate electrode pattern. The gate electrode 13 formed in the photodiode region is a reset gate electrode, and the gate electrode 13 formed in the logic region is a drive gate electrode or select gate electrode. Ions are then implanted using an ion implantation mask (not shown) for opening the photodiode region, such that an N-type photodiode impurity area 14 is formed in the semiconductor layer 10 so as to be aligned at one side of the reset gate electrode. In addition, low-concentration impurity ions are implanted into the active area excluding the photodiode region, for example, the semiconductor layer 10 between the reset gate electrode and the drive gate electrode, thereby forming $n^-$ areas 15 which will become low-concentration source/drain areas of the transistors.

Then, as shown in FIG. 3B, a spacer-forming insulating film 16 is formed on the entire surface of the gate insulating film 12 and the gate electrodes 13. The spacer-forming insulating film 16 is formed by sequentially depositing, for example, a $SiO_2$ film of 200 Å and a SiN film of 800 Å.

Next, as shown in FIG. 3C, the spacer-forming insulating film 16 is primarily etched to remain at both sides of the gate electrode 13 after primary etching, thereby forming spacers 16a. Primary etching is controlled to have a $SiN:SiO_2$ etching ratio of 1.62:1. As the device is decreased in size, the length of the gate is gradually decreased, causing a narrow line effect. The narrow line effect is a phenomenon of irregular increase in the resistance of the device, and a salicide process is performed to alleviate the narrow line effect. Salicide is a material having a low resistance and is formed by reaction of silicon and metal. In particular, salicide containing titanium suffers from an agglomeration phenomenon in which titanium incompletely reacts with silicon, whereby titanium and silicon remain in an amorphous shape. Thus, in order to avoid such a phenomenon, the spacers 16a must be over-etched so as to open upper side surfaces of the gate electrode 13. Typically, in a 0.25 µm process, the over-etched spacers must have a length of 250 Å or more; in a 0.18 µm process, the over-etched spacers must have a length of 500 Å or more.

For this reason, the spacers 16a are over-etched as shown in FIG. 3D. The over-etching process is performed by two steps, whereby after initial etching is performed under the condition that only the SiN film can be selectively etched, subsequent etching is performed at a $SiN:SiO_2$ etching ratio of 3.53:1. Thus, the SiN film is completely removed, and the $SiO_2$ film remains at a thickness of about 25 Å. Thus, both sides of the gate electrode 13 are formed with insulating films, each having a height of 75 Å, comprising the $SiO_2$ film of 25 Å and the lower gate insulating film 12 of 50 Å.

As described above, over-etching of the spacers is performed for the purpose of allowing easy formation of salicide and is generally used by a logic process. In the CMOS image sensor, however, the semiconductor layer 10 of the photodiode region is damaged during over-etching of the spacers, causing dark current generation.

Thereafter, as shown in FIG. 3E, high-concentration ions are implanted into the active area excluding the photodiode region using the spacers 16a as a mask, thereby forming an $n^+$ area 17 which will become high-concentration source/drain areas of the transistors, and then a salicide-protecting insulating film 18 is formed over the entire surface of the resultant. To complete the manufacture a conventional CMOS image sensor, photoresist 19 is formed as shown in FIG. 3F, so as to cover the photodiode region; as shown in FIG. 3G, the salicide-protecting insulating film 18 is isotropically etched using the photoresist 19 as the mask; and finally, the photoresist 19 is removed as shown in FIG. 3H. Although not shown in the drawings, a salicide film is formed on the gate electrode 13 and the $n^+$ areas 17 by performing a salicide process using the salicide-protecting insulating film 18 as the mask.

In the method for manufacturing the conventional CMOS image sensor as described above, salicide must be formed on the gate electrode in the logic region to reduce the resistance of transistors, and, in this case, the spacers must be over-etched so as to open the sides of the gate electrode in order to prevent the agglomeration phenomenon, in which silicon incompletely reacts with metal of a high melting point and remains in an amorphous shape. With the conventional method, however, the semiconductor layer in the photodiode region is damaged during the over-etching process, thereby causing dark current.

SUMMARY OF THE INVENTION

Accordingly, the present invention is directed to a method for manufacturing a CMOS image sensor that substantially obviates one or more problems due to limitations and disadvantages of the related art.

An object of the present invention is to provide a method for manufacturing a CMOS image sensor, which prevents damage of a semiconductor layer in a photodiode region during an over-etching process on sidewalls.

Another object of the present invention is to provide a method for manufacturing a CMOS image sensor, which prevents damage of the semiconductor layer in the photodiode region, thereby preventing a generation of dark current.

Additional advantages, objects, and features of the invention will be set forth in part in the description which follows and in part will become apparent to those having ordinary skill in the art upon examination of the following or may be learned from practice of the invention. The objectives and other advantages of the invention may be realized and attained by the structure particularly pointed out in the written description and claims hereof as well as the appended drawings.

To achieve these objects and other advantages in accordance with the purpose of the invention, as embodied and broadly described herein, there is provided a method for manufacturing a CMOS image sensor, comprising forming a gate electrode on a semiconductor layer having defined regions of a photodiode region and a logic region, such that a gate oxide film is interposed between the semiconductor layer and the gate electrode; forming sidewall insulating films at both sides of the gate electrode, followed by forming a salicide-preventing film over an overall surface of the gate electrode and insulating films; removing the salicide-preventing film formed in the logic region; and removing a portion of the sidewall insulating films exposed by removing the salicide-preventing film, thereby exposing an upper side surface of the gate electrode.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE INVENTION

Reference will now be made in detail to the preferred embodiments of the present invention, examples of which are illustrated in the accompanying drawings. Wherever possible, like reference numbers will be used throughout the drawings to refer to the same or similar parts.

Figure 1:
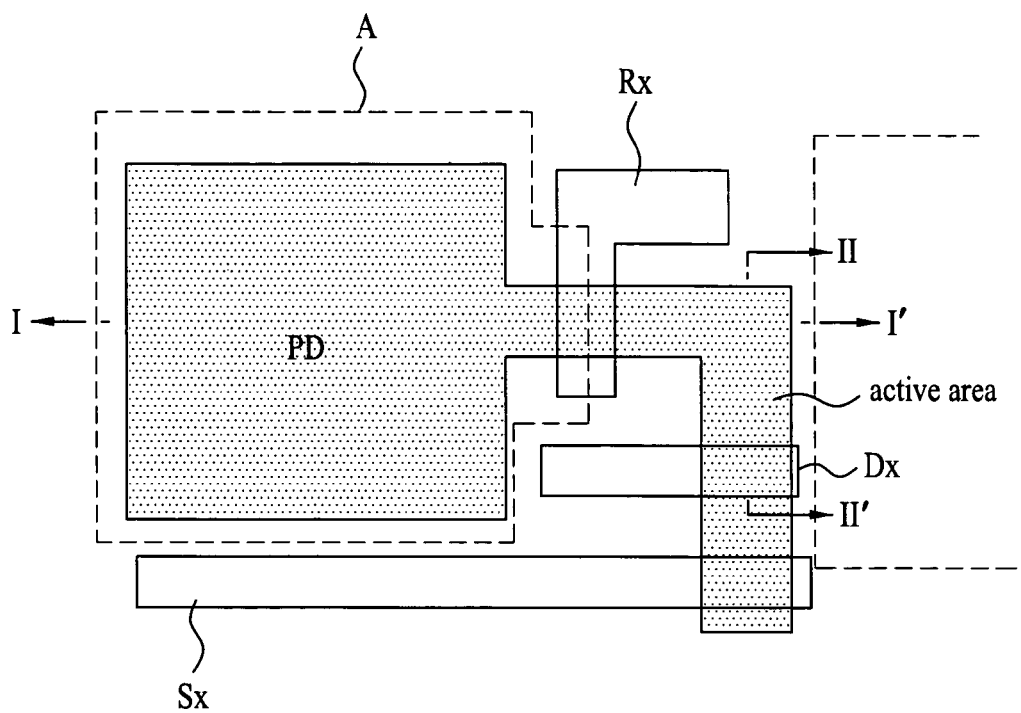
FIG. 1 is a layout diagram of a unit pixel in a conventional 3-T type CMOS image sensor.
Figure 2:
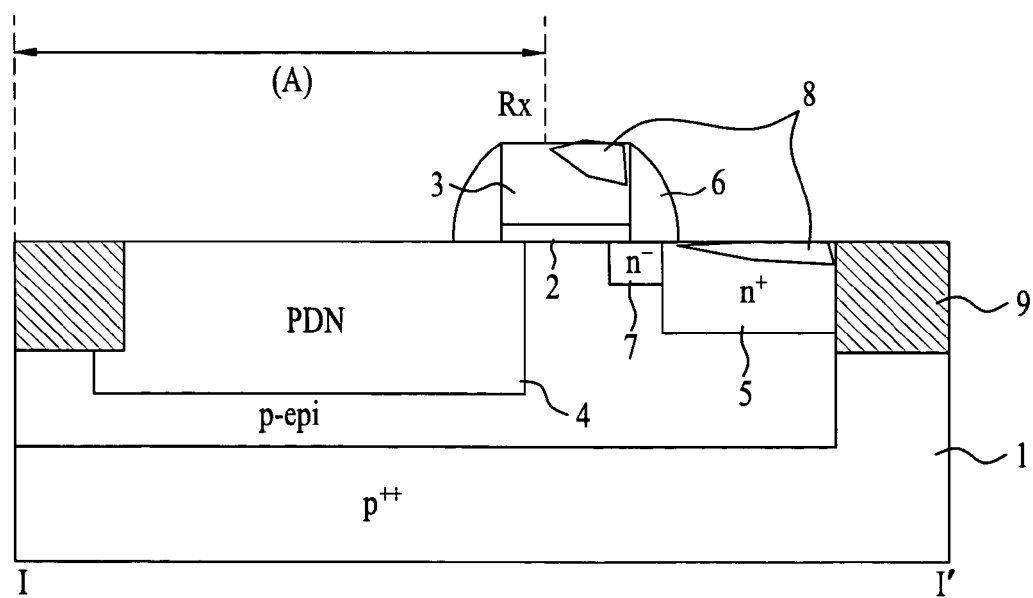
FIG. 2 is a cross-sectional view taken along line I-I' of FIG. 1.
Figure 3A:
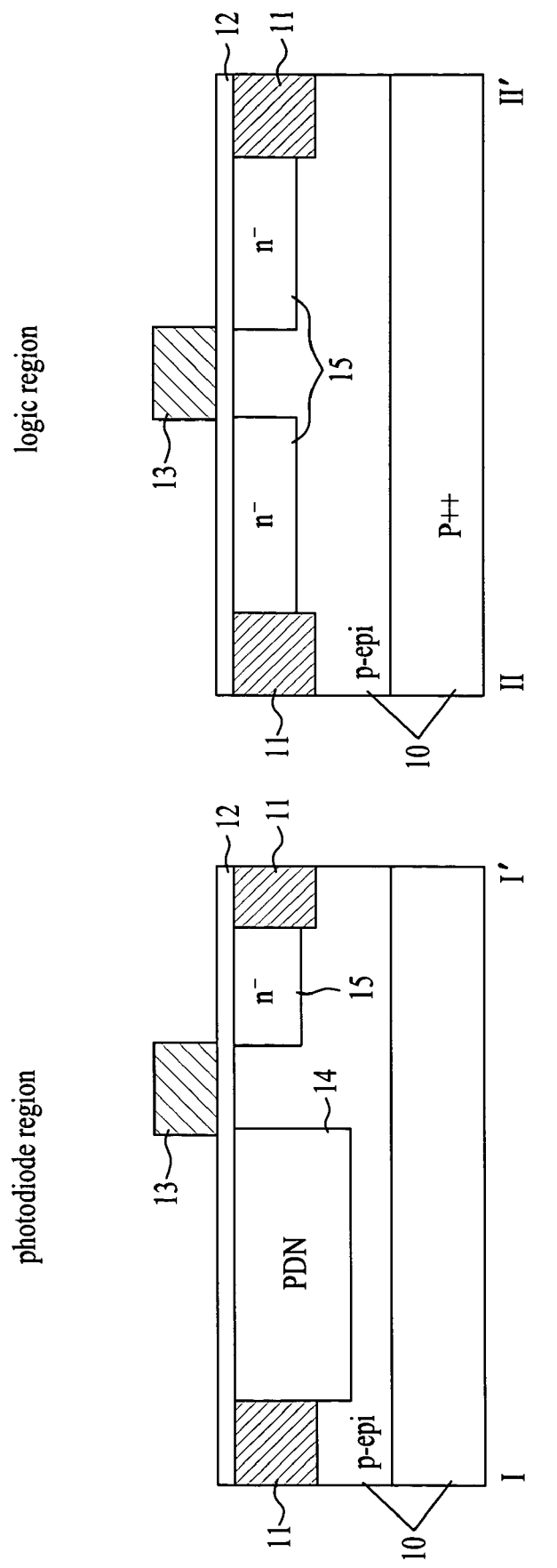
FIGS. 3A-3H are cross-sectional views illustrating a method for manufacturing a conventional CMOS image sensor.
Figure 3B:
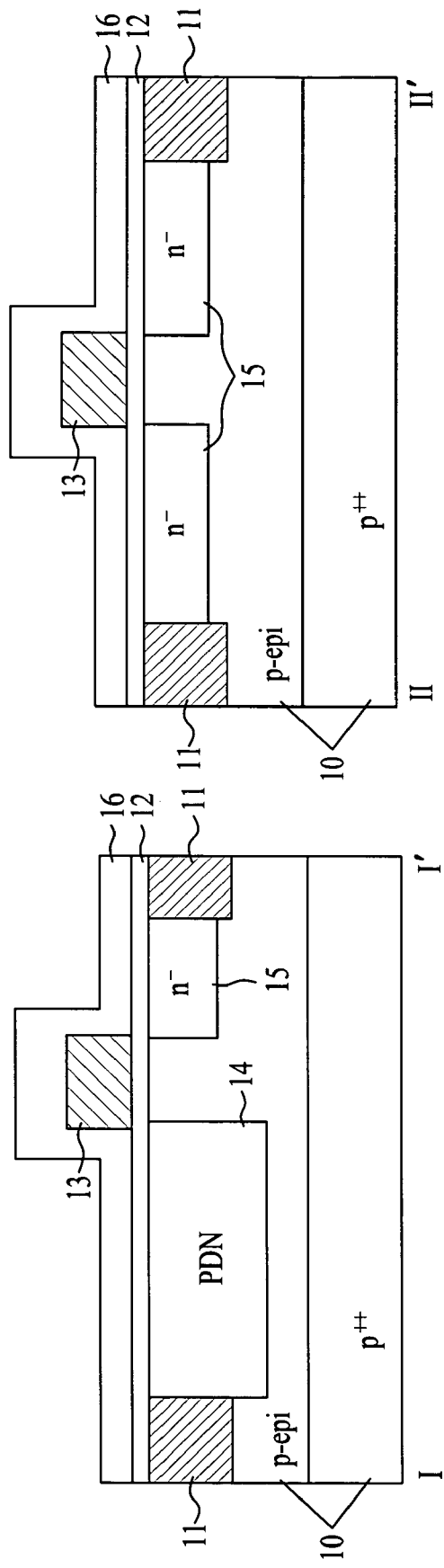
Figure 3C:
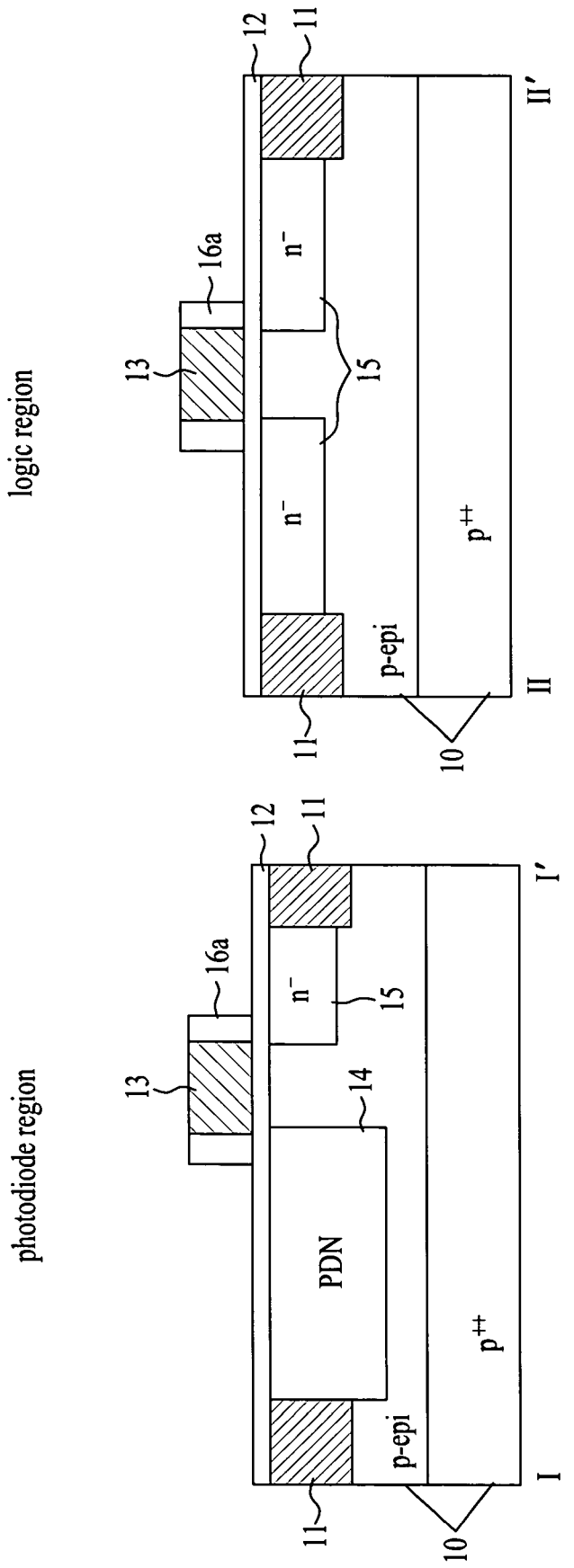
Figure 3D:
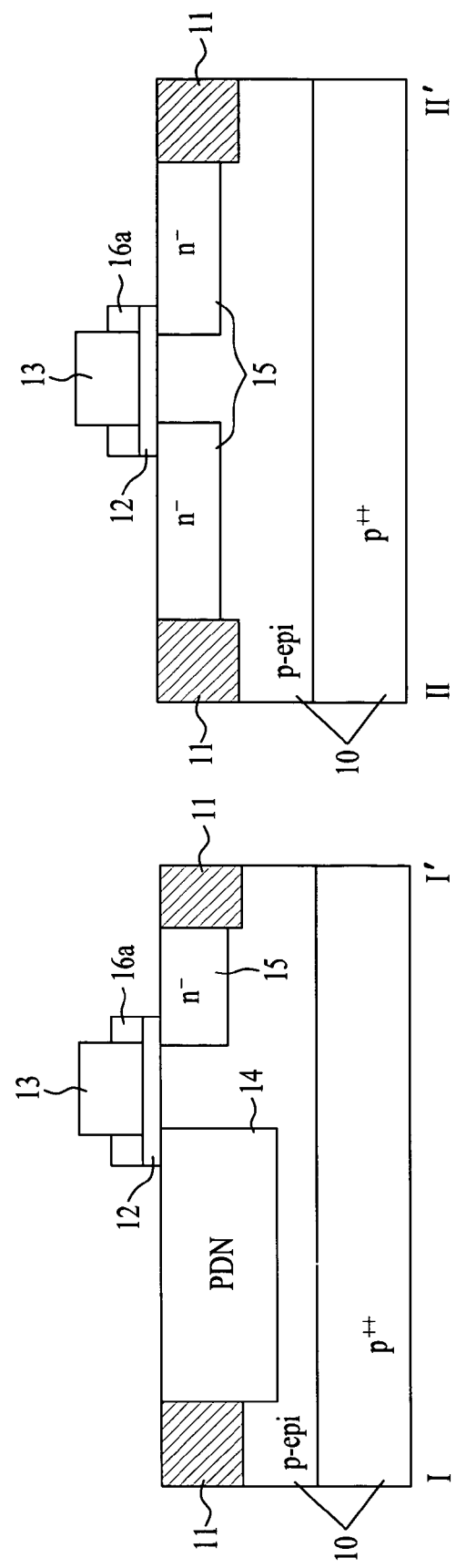
Figure 3E:
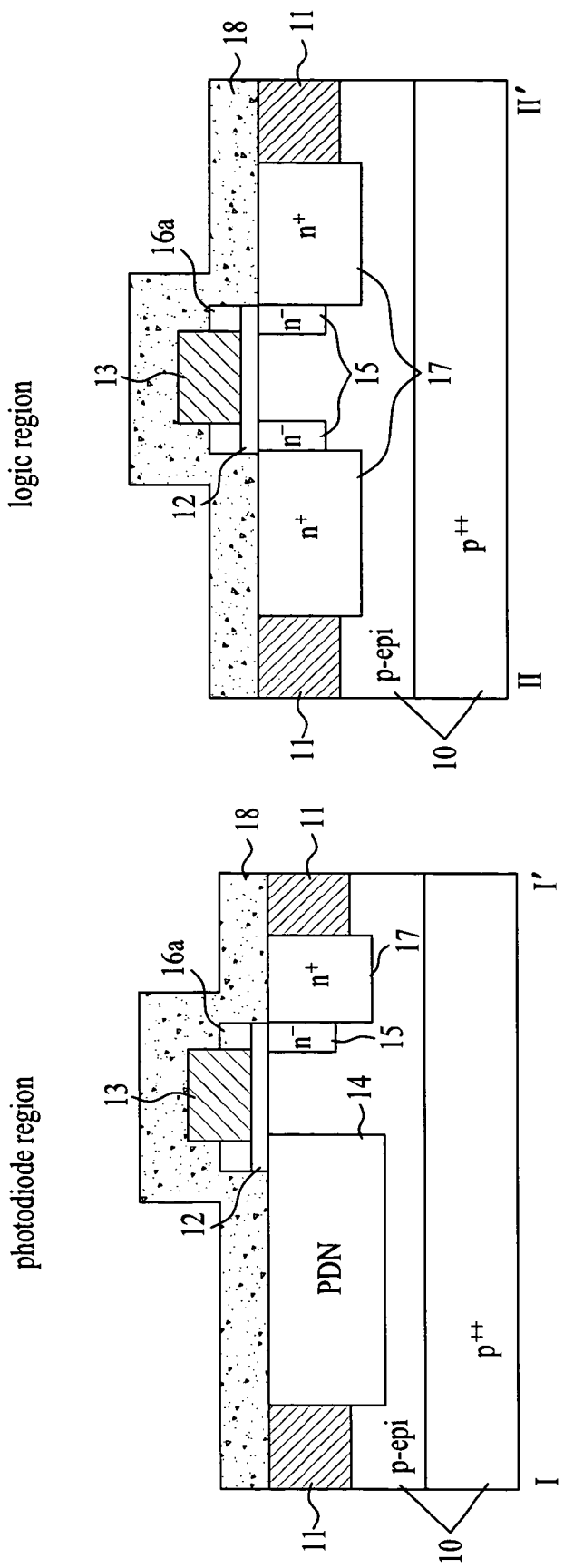
Figure 3F:
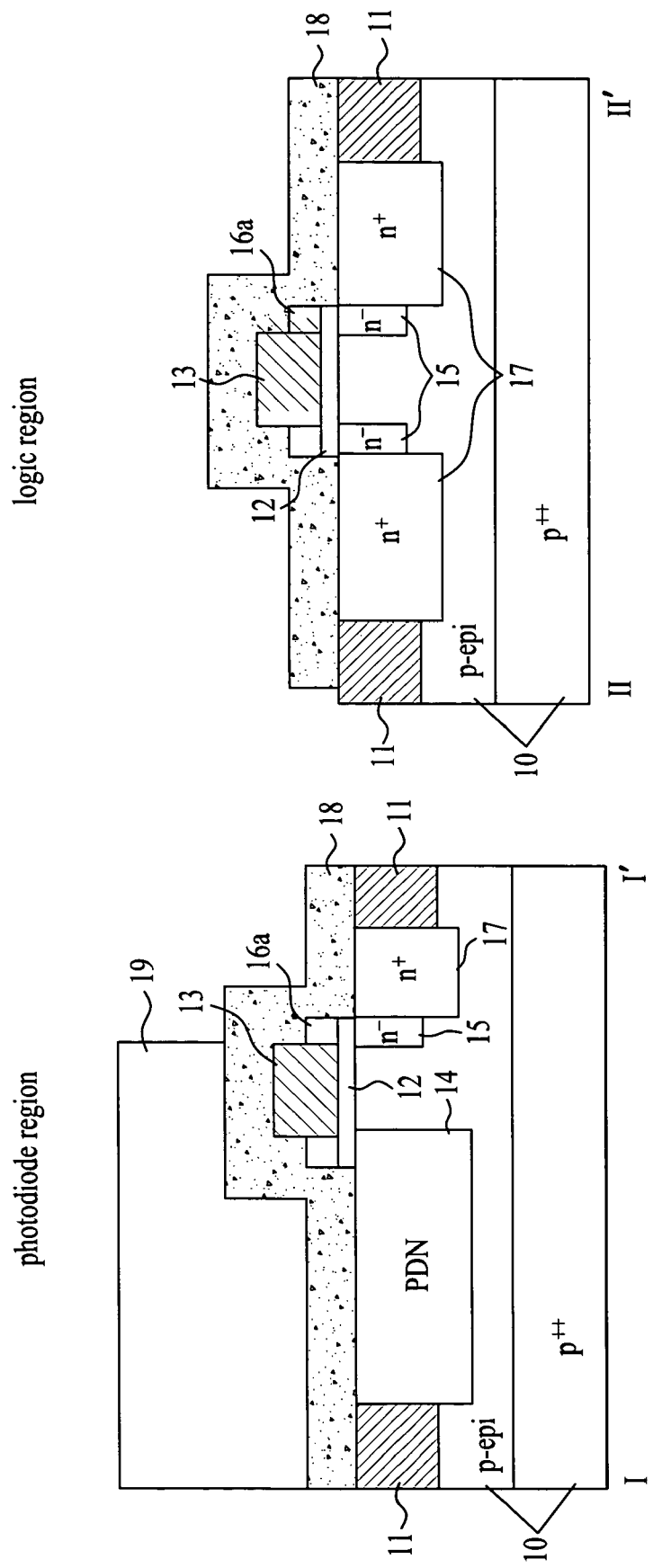
Figure 3G:
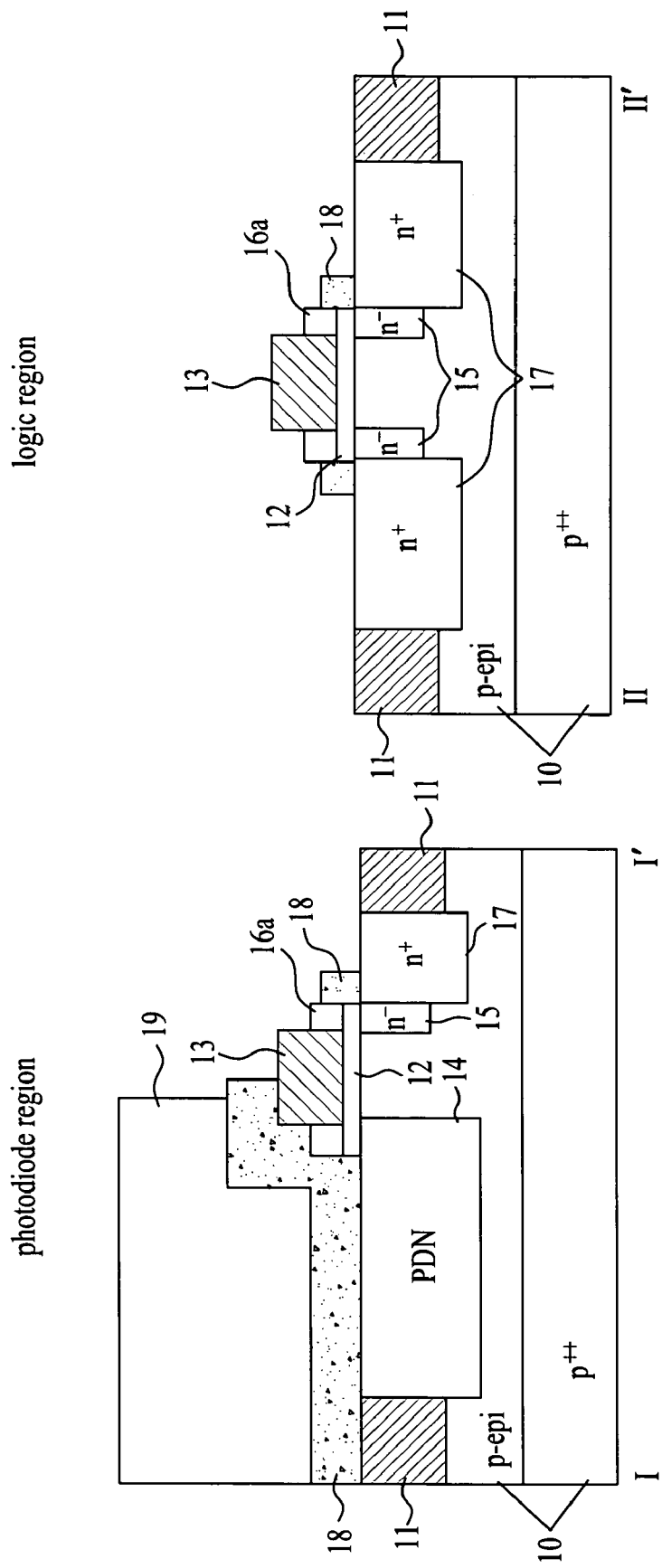
Figure 3H:
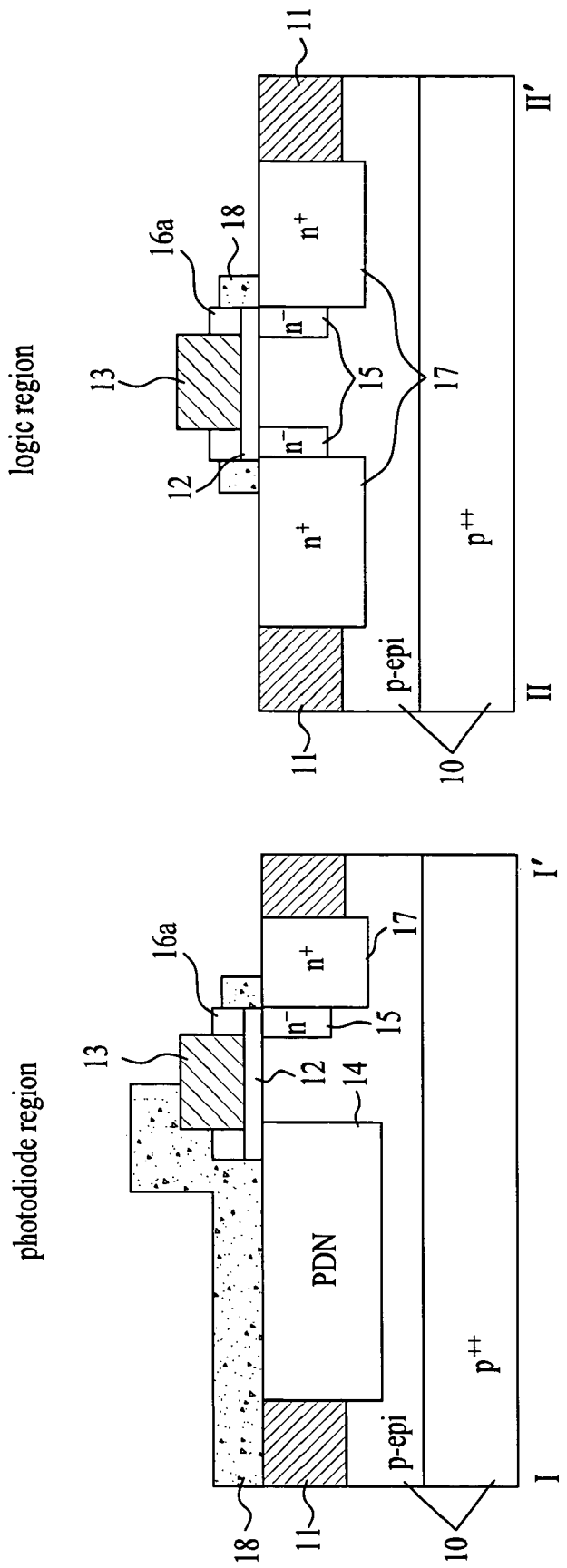

A method for manufacturing a CMOS image sensor according to the present invention will be described with reference to FIGS. 4A-4H, in which each drawing shows the photodiode region (left side, corresponding to line I-I' of FIG. 1) and the logic region (right side, corresponding to line II-II' of FIG. 1). Here, a semiconductor layer 20 is one having a high-concentration $p^{++}$ layer and a p-epitaxial layer in a stacked formation.

Figure 4A:
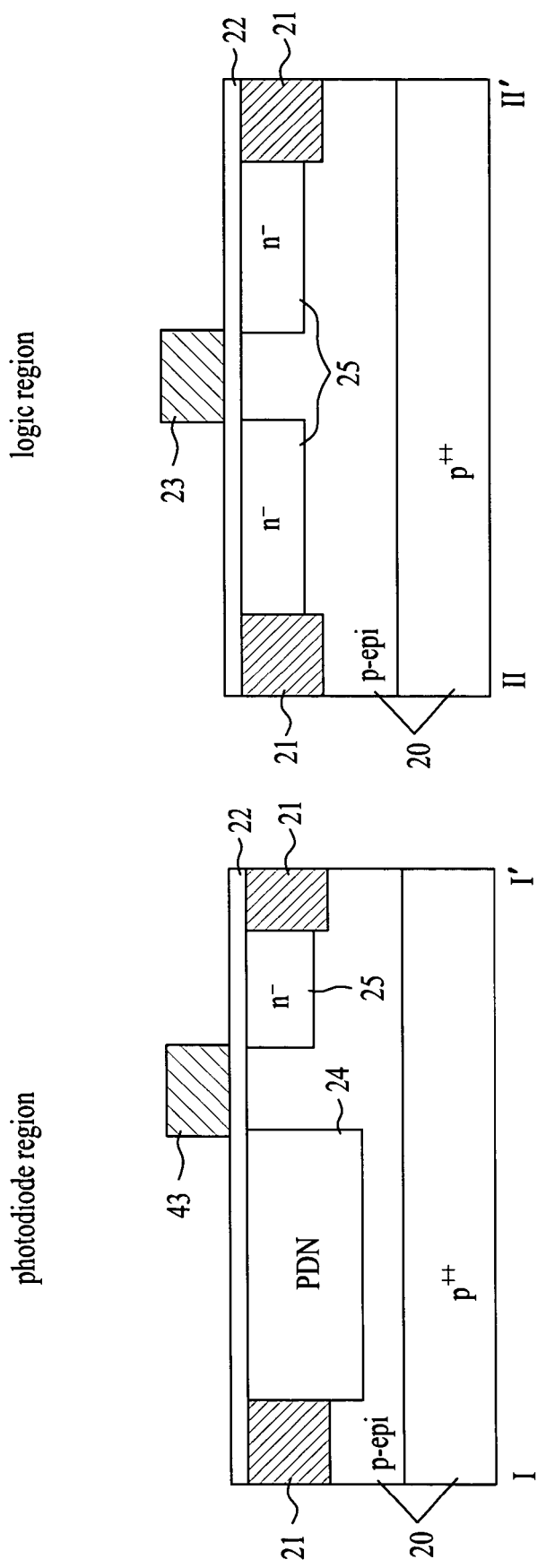
FIGS. 4A-4H are cross-sectional views illustrating a method for manufacturing a CMOS image sensor according to one embodiment of the present invention.

Initially, as shown in FIG. 4A, an active area is defined by forming a local field oxide film 21 on the semiconductor layer 20 through an oxidation process, for example, a thermal oxidation process. Then, an oxide film-based gate insulating film 22 is formed to a thickness of about 50 Å on the entire surface of the active area. Next, after depositing a single or multiple gate conductive films of polysilicon, tungsten, or the like, gate electrodes are formed by patterning through the gate conductive film in a patterning process using a mask for forming a gate electrode pattern. The gate electrode formed in the photodiode region is a reset gate electrode 43, and the gate electrode formed in the logic region is a drive gate electrode 23 (or select gate electrode 23). Ions are then implanted using an ion implantation mask (not shown) for opening the photodiode region, and an N-type photodiode impurity area (PDN) 24 is then formed in the semiconductor layer 20 so as to be aligned at one side of the reset gate electrode 43. Low-concentration impurity ions are implanted into the active area excluding the photodiode region, for example, the semiconductor layer 20 between the reset gate electrode 43 and the drive gate electrode 23, thereby forming n$^-$ areas 25 which will become low-concentration source/drain areas of the transistors.

Figure 4B:
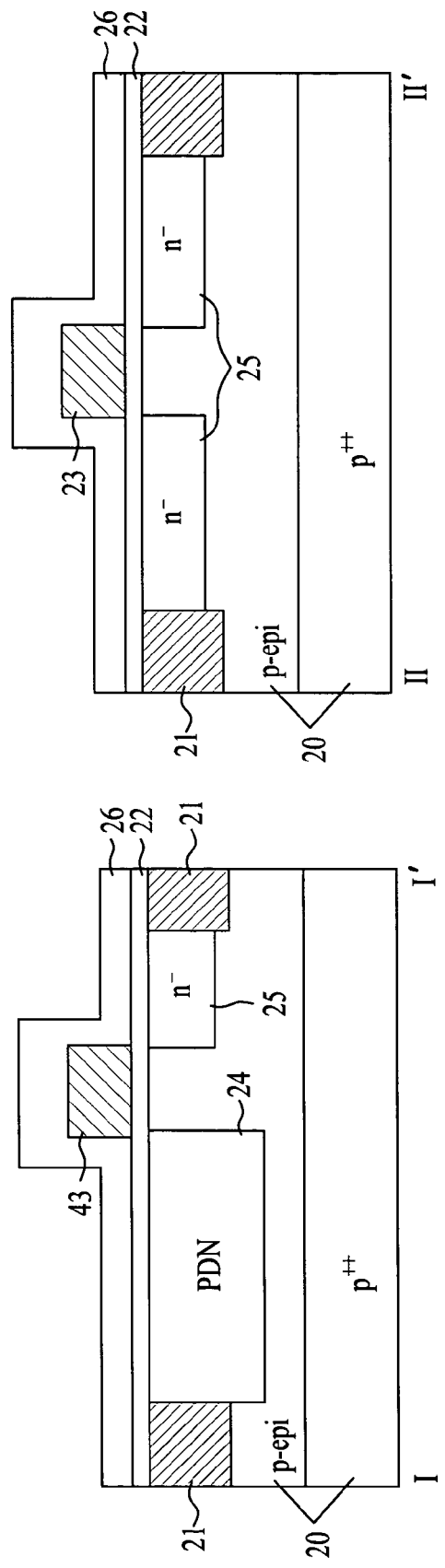

Then, as shown in FIG. 4B, a spacer-forming insulating film 26 is formed on the entire surface of the gate insulating film 22 and the gate electrodes 43 and 23. The spacer-forming insulating film 26 is formed by depositing, for example, a single layer (i.e., a single insulating film) or multiple layers (i.e., a stacked film formation) of a SiO$_2$ film of 100~300 Å and/or a SiN film of 800 Å. Here, the stacked film formation preferably comprises first and second insulating films having different etching ratios.

Figure 4C:
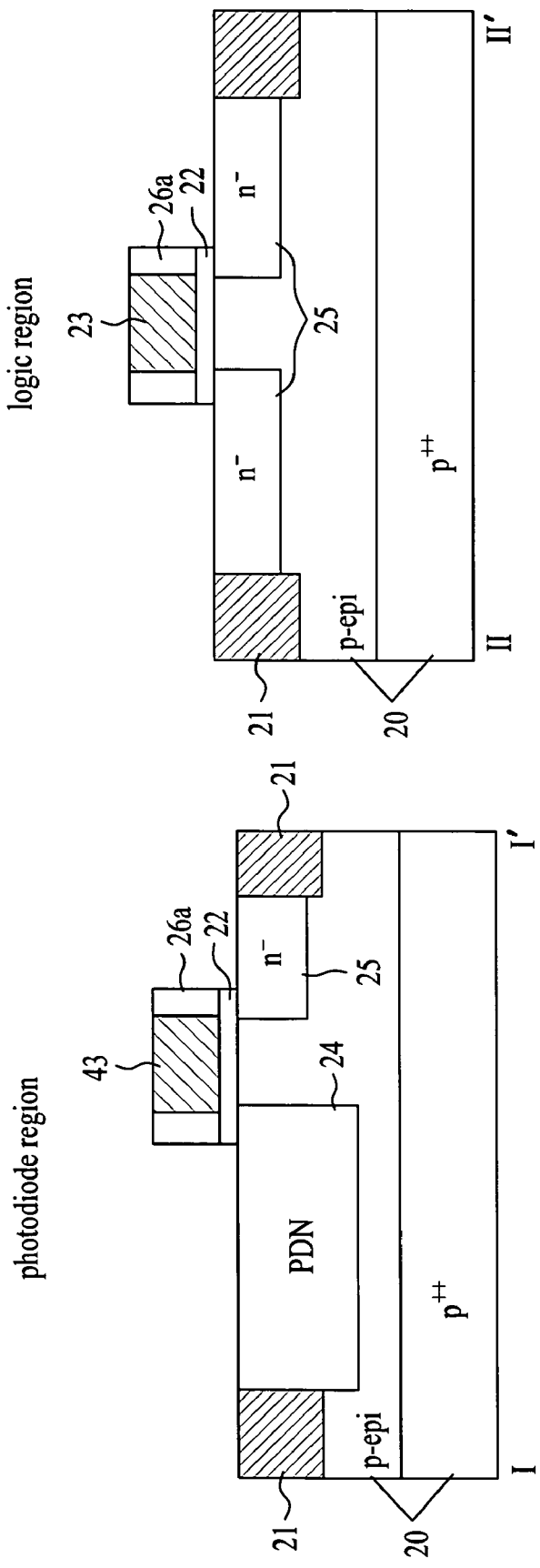

Next, as shown in FIG. 4C, the spacer-forming insulating film 26 is etched to remain at both sides of the gate electrodes 43 and 23 after the etching process, thereby forming spacers 26a. Unlike the conventional method, the spacers 26a will not be over-etched, such that there is no exposure of the sides of the gate electrodes.

Figure 4D:
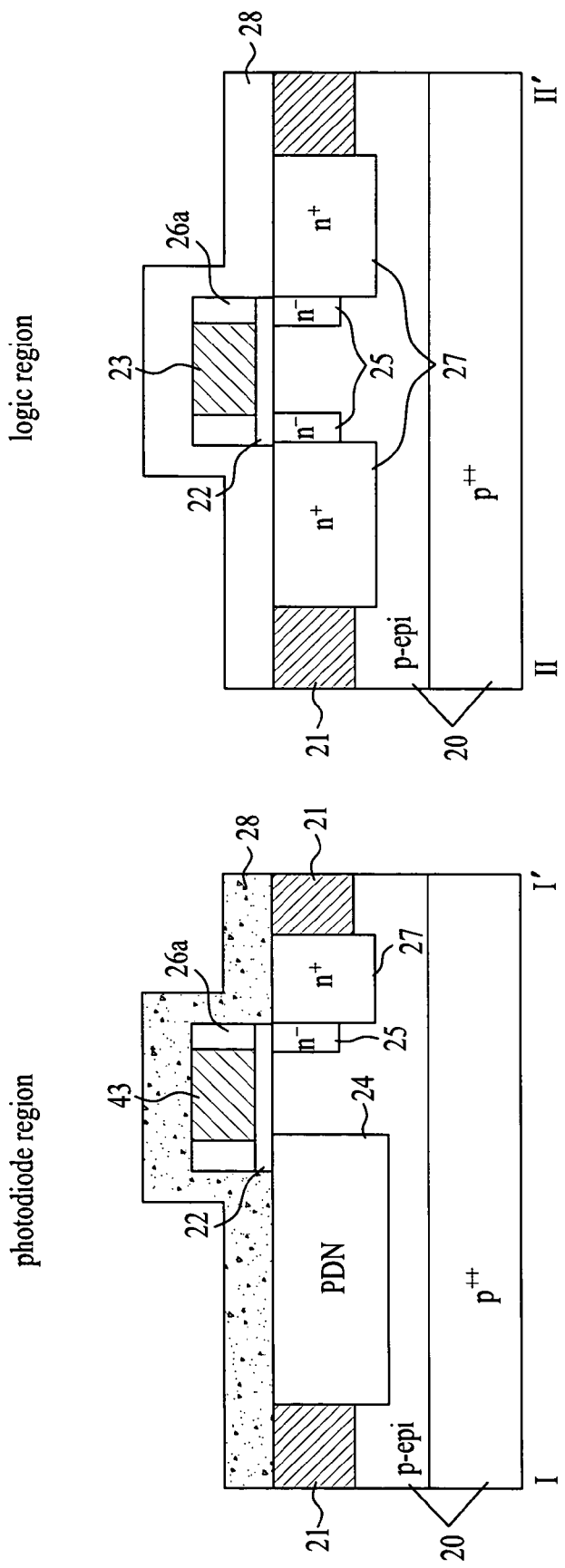

Next, as shown in FIG. 4D, high-concentration impurity ions are implanted into the active area excluding the photodiode region using the spacers 26a as a mask, thereby forming n$^+$ areas 27 which will become high-concentration source/drain areas of the transistors, and then a salicide-protecting insulating film 28 is formed on the entire surface of the resultant.

Figure 4E:
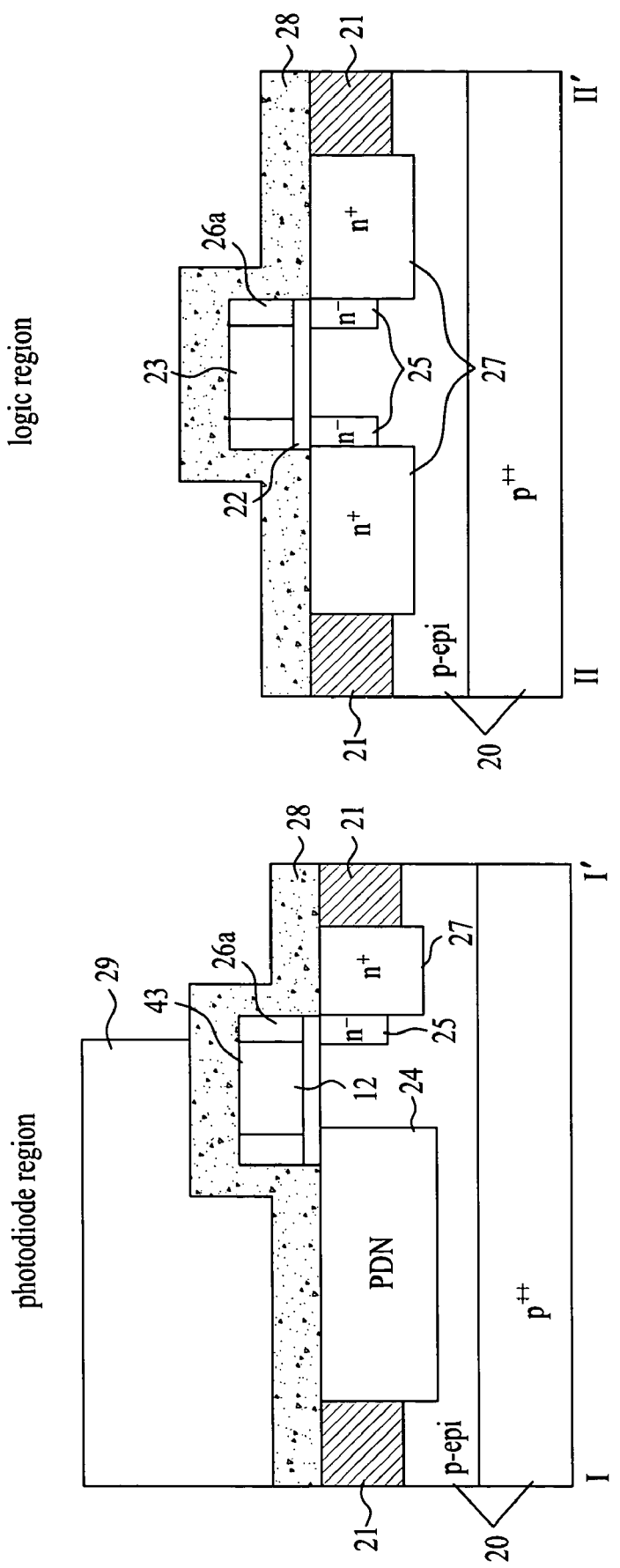

Next, as shown in FIG. 4E, a photoresist 29 is formed so as to cover the photodiode region.

Figure 4F:
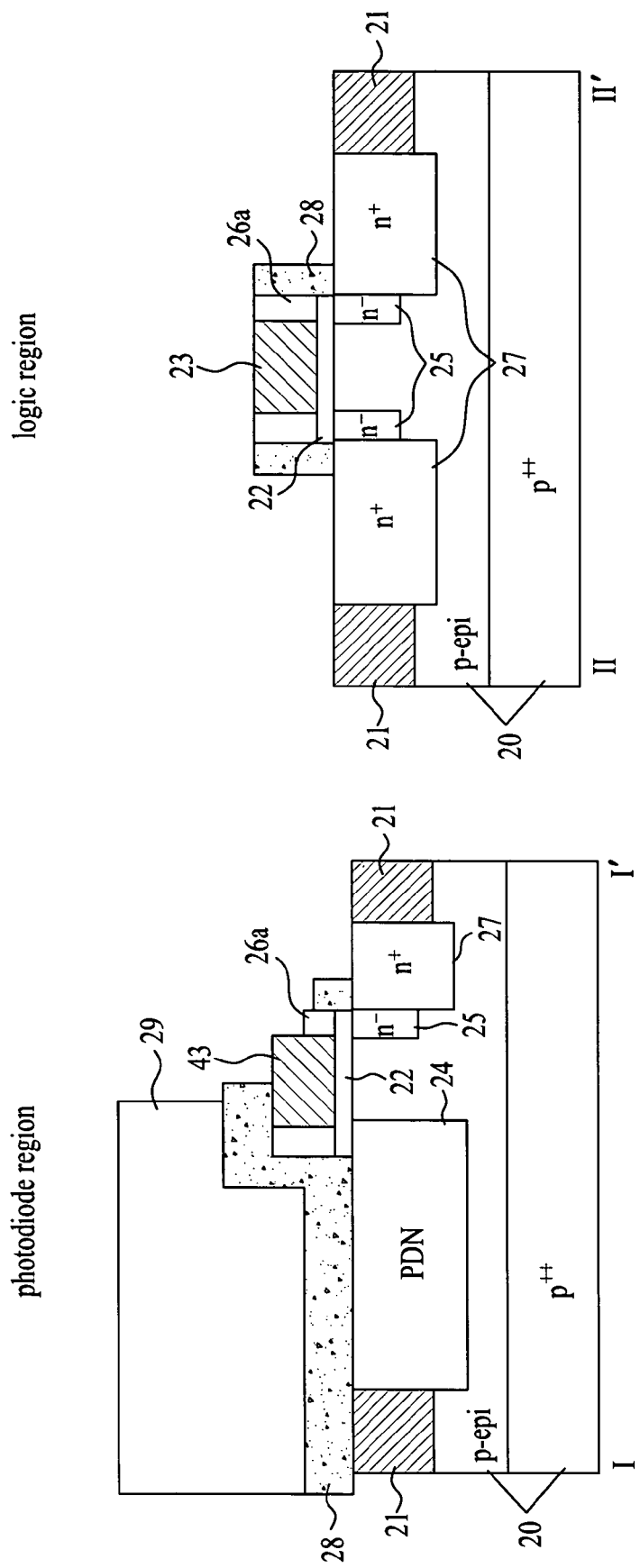
Figure 4G:
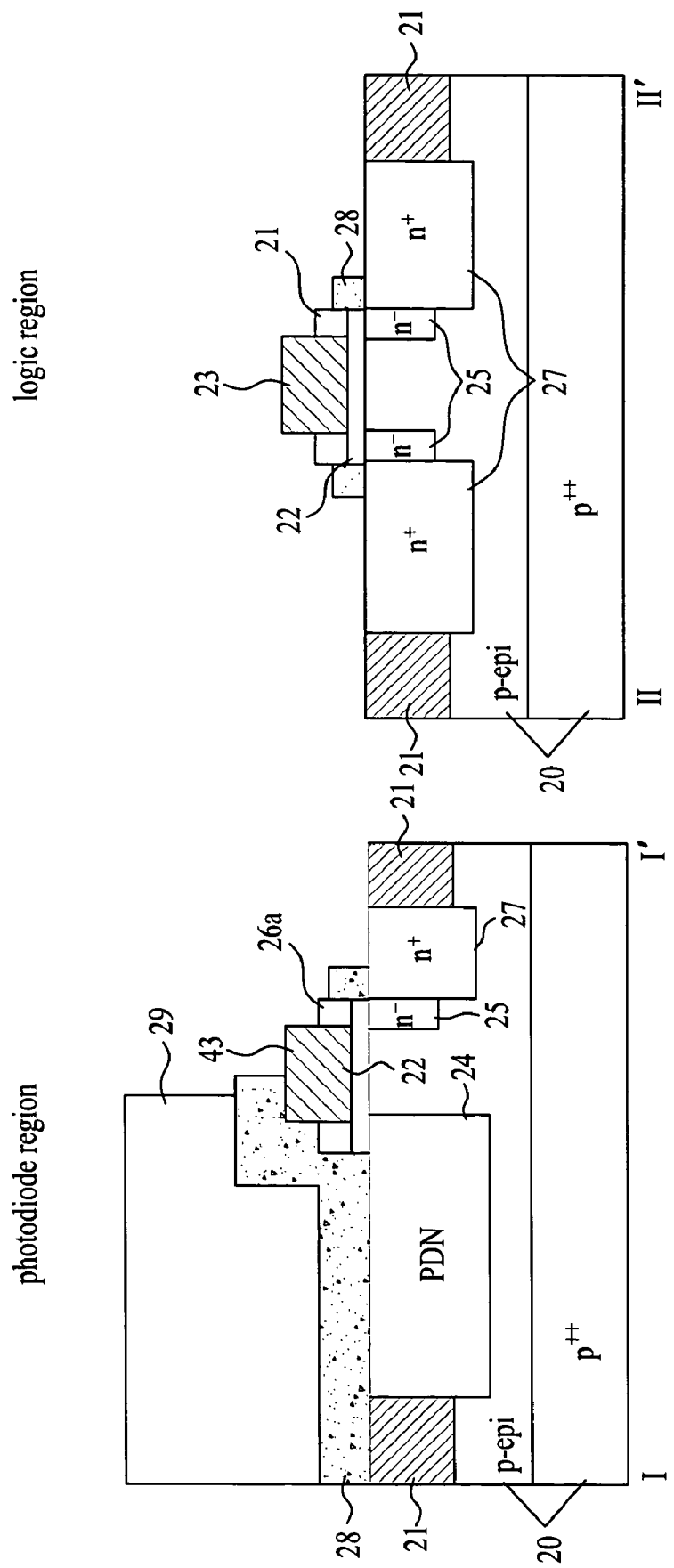

Next, as shown in FIG. 4F, the salicide-protecting insulating film 28 is isotropically etched using the photoresist 29 as the mask, and the spacers 26 of the gate electrode 43, which are partially exposed by removing the salicide-protecting insulating film 28, are over-etched to open upper side surfaces of the gate electrode. The over-etching process is performed by two steps, whereby after initial etching is performed under the condition that only the SiN film can be selectively etched, subsequent etching is performed at a SiN:SiO$_2$ etching ratio of 3.53:1. Thus, the SiN film is completely removed, and the SiO$_2$ film remains at a thickness of about 25 Å. Thus, both sides of the gate electrodes 43 and 23 are formed with insulating films, each having a height of 75 Å, comprising the SiO$_2$ film of 25 Å and the gate insulating film 22 of 50 Å.

During the over-etching process, since the photodiode region is covered with the salicide-protecting insulating film 28 acting as the mask, it is possible to prevent the semiconductor layer 20 in the photodiode region from being damaged by over-etching.

Figure 4H:
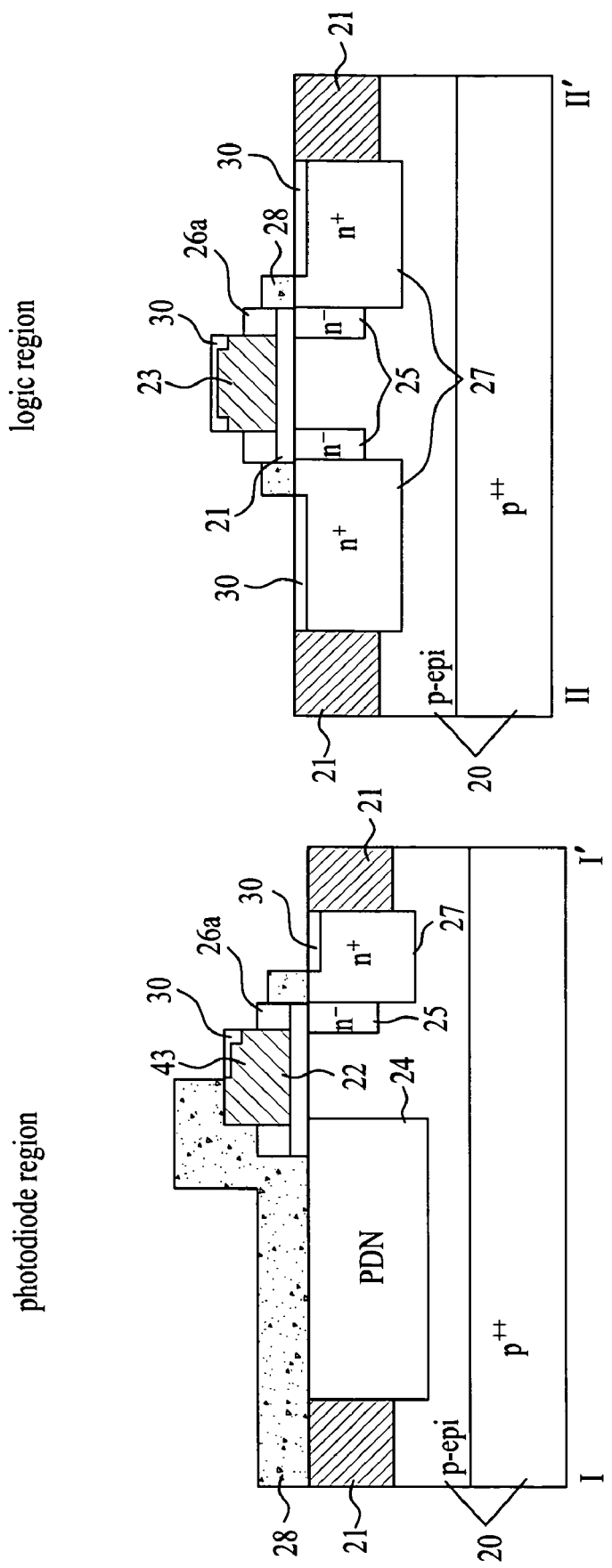

Then, as shown in FIG. 4H, the photoresist 29 is removed.

Although not shown in the drawings, a salicide film is formed on the gate electrodes 43 and 23 and the n$^+$ areas 27 by a salicide process using the salicide-protecting insulating film 18 as the mask.

As a result, the CMOS image sensor according to the invention is completely manufactured.

As described above, the method for manufacturing the CMOS image sensor according to the present invention enables a prevention of the semiconductor layer in the photodiode region from being damaged by over-etching, since the photodiode region is covered with the salicide-protecting insulating film 28 acting as the mask during the over-etching process for opening the side of the gate electrode. Thus, dark current caused by the damage of the substrate is prevented from being generated, thereby enhancing performance of the image sensor.

It will be apparent to those skilled in the art that various modifications can be made in the present invention without departing from the spirit or scope of the invention. Thus, it is intended that the present invention covers such modifications provided they come within the scope of the appended claims and their equivalents.

What is claimed is:

1. A method for manufacturing a CMOS image sensor, comprising:

preparing a semiconductor substrate having a photodiode region and a logic region;

forming a first gate electrode on the photodiode region and a second gate electrode on the logic region, such that a gate oxide film is interposed between the semiconductor layer and the first and second gate electrodes;

forming sidewall insulating films at both sides of the first and second gate electrodes;

forming a salicide-preventing film over an overall surface of the semiconductor substrate including the first and second gate electrodes and the sidewall insulating films;

removing a portion of the salicide-preventing film so as to cover the photodiode region and to expose the logic region and a portion of the sidewall insulating film of the first gate electrode; and removing a portion of the sidewall insulating films exposed by removing the salicide-preventing film, thereby exposing an upper side surface of the first and second gate electrodes.

2. The method as set forth in claim 1, further comprising:

forming a salicide film on the exposed first and second gate electrodes using the salicide-preventing film as a mask after exposing the upper side surface of the first and second gate electrodes.

3. The method as set forth in claim 1, wherein the sidewall insulating film is formed of one of a single insulating film and a stacked film formation comprising first and second insulating films having different etching ratios.

4. The method as set forth in claim 3, wherein the first insulating film is an oxide-based insulating film.

5. The method as set forth in claim 3, wherein the second insulating film is a nitride insulating film.

6. The method as set forth in claim 3, wherein the first insulating film has a thickness of 100~300 Å.

* * * * *